US008618823B2

(12) United States Patent
Tada et al.

(10) Patent No.: US 8,618,823 B2
(45) Date of Patent: Dec. 31, 2013

(54) SEMICONDUCTOR DEVICE

(75) Inventors: Kenichi Tada, Kodaira (JP); Koki Tsutsumida, Ome (JP); Masatoshi Kawashima, Hamura (JP); Hideki Hayashi, Ome (JP); Tsutomu Sato, Ninomiyamachi (JP); Koichi Sugimoto, Odawara (JP)

(73) Assignee: Hitachi, Ltd., Tokyo (JP)

( * ) Notice: Subject to any disclaimer, the term of this patent is extended or adjusted under 35 U.S.C. 154(b) by 415 days.

(21) Appl. No.: 13/006,325

(22) Filed: Jan. 13, 2011

(65) Prior Publication Data
US 2011/0204908 A1 Aug. 25, 2011

(30) Foreign Application Priority Data

Feb. 18, 2010 (JP) ................................ 2010-033064

(51) Int. Cl.
*G01R 31/28* (2006.01)
(52) U.S. Cl.
USPC ............. 324/750.3; 324/762.02; 324/762.06
(58) Field of Classification Search
CPC ............................ G01R 31/28; G01R 31/3187
USPC .................... 324/750.3, 762.02, 762.06, 535; 327/144; 438/14–18; 714/733–734
See application file for complete search history.

(56) References Cited

U.S. PATENT DOCUMENTS

| 6,484,294 B1 * | 11/2002 | Kiyoshige et al. ............ 716/136 |
| 2003/0094934 A1 | 5/2003 | Date et al. |
| 2004/0044485 A1 | 3/2004 | Kondo |
| 2005/0053180 A1 * | 3/2005 | Nose et al. .................... 375/354 |

FOREIGN PATENT DOCUMENTS

| JP | 2007-325960 | * | 9/2007 | ............... H03K 5/15 |
| WO | WO 2010016857 | * | 2/2010 | ............... G06F 7/38 |

* cited by examiner

*Primary Examiner* — Jermele M Hollington
*Assistant Examiner* — Robert Alejnikov, Jr.
(74) *Attorney, Agent, or Firm* — Miles & Stockbridge P.C.

(57) ABSTRACT

A semiconductor device is designed to facilitate analyzing a position and a cause of the failure of an integrated circuit adopting a polyphase clock. To this end, the semiconductor device is provided with an error detecting unit that detects that a problem of the operation occurs in the integrated circuit, a clock state holding unit that holds the information of phases in a predetermined term of a two- or more-phase clock and an output unit that outputs the information of the phases in the predetermined term of the two- or more-phase clock when the error detecting unit detects that the problem of the operation occurs in the integrated circuit.

5 Claims, 7 Drawing Sheets

FIG. 5A
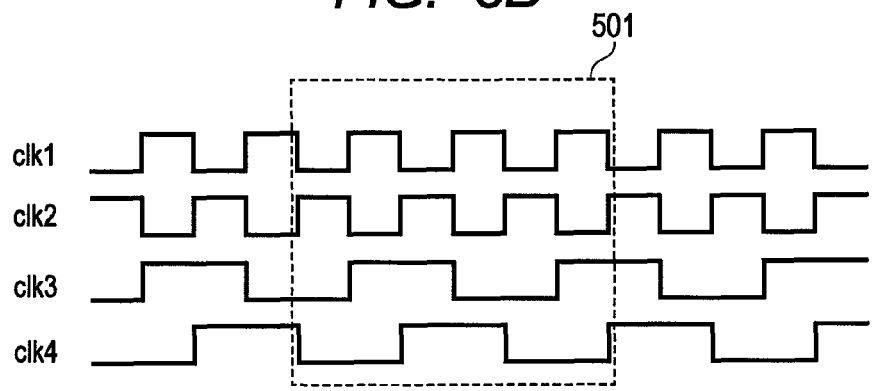
FIG. 5B
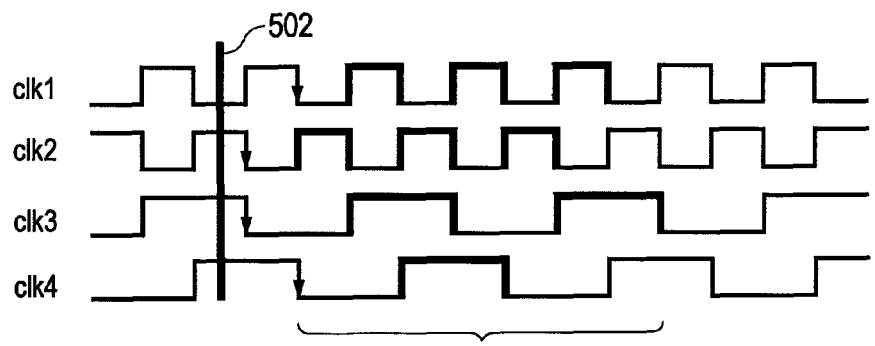
FIG. 5C

SEMICONDUCTOR DEVICE

CLAIM OF PRIORITY

The present application claims priority from Japanese patent application JP 2010-033064 filed on Feb. 18, 2010, the content of which is hereby incorporated by reference into this application.

FIELD OF THE INVENTION

The present invention relates to a semiconductor device and its failure analysis method. Particularly, the present invention relates to a semiconductor device adopting a polyphase clock and its failure analysis method.

BACKGROUND OF THE INVENTION

To analyze failure caused in a semiconductor integrated circuit, the output of a signal based upon the input of the signal is monitored, and a position and a cause of the failure are estimated. An expected value of the output of the signal based upon the input of the signal can be calculated by a computer where functions of the integrated circuit are modeled and the same operation can be simulated. When the integrated circuit is normal, a value of an output signal from the integrated circuit coincides with the expected value calculated by the computer. Conversely, when the values do not coincide, it can be said that failure occurs. In the next step, it is estimated what sort of variation of the functional model formed by the computer (called a failure model) has the same output expected value as a signal output from the integrated circuit. When an output expected value of a certain failure model coincides with a value of an output signal from the integrated circuit, it can be said that the failure model is functionally equal to the failure of the integrated circuit. Hereby, the position and the cause of the failure can be analyzed.

To execute the above-mentioned analysis, a condition on which the operation of the integrated circuit is different from an expected value is required to be found. For example, it can be expected that as for failure (a short-circuit) that a value of a signal in a signal conductor is fixed to 0 or 1, the nonconformity of an output signal value and an expected value can be relatively easily found by increasing the variations of the combination with a value of an input signal to the integrated circuit. In the meantime, some failure is not revealed on conditions except a certain specific condition and an integrated circuit having the failure appears to function like a normal one. For example, failure caused because of power supply voltage, temperature, a frequency of a clock or power supply noise and others can be given. When such an integrated circuit is built in a product and is operated, a problem of the operation is observed. However, when the integrated circuit (the chip) is detached from the product for failure analysis and is operated in an LSI tester, an expected value of output coincides with all input signals and the integrated circuit is sometimes indistinguishable from normal LSI (non-reproduction of failure).

To reproduce failure, a condition of measurement is required to be made to approach an operating condition when the chip is built in the product. Therefore, the LSI tester is provided with a function for changing a condition such as power supply voltage, temperature and a frequency of a clock and efforts toward searching a condition on which the integrated circuit makes operation different from the expected value (reproducing failure) are made. However, in the current LSI tester, it is sometimes difficult to change a frequency of a clock, power supply noise and others out of causes that make failure revealed. For example, an LSI tester corresponding to a high-frequency clock is high-priced and in the current LSI tester, it is difficult to prepare an operating environment in which power supply noise when the integrated circuit is built in the product can be fully simulated.

Therefore, a trial for reproducing failure by making the integrated circuit operate in a state in which it is built in the product is proposed. A method of analyzing a position and a cause of failure with the integrated circuit built in the product is disclosed in Japanese Unexamined Patent Application Publication No. 2004-101203.

SUMMARY OF THE INVENTION

In recent multiple integrated circuits, a polyphase clock is adopted for an input clock. Plural clocks are input to an integrated circuit adopting a polyphase clock, each clock is independent in timing, and each clock is mutually asynchronous. The failure of LSI adopting a polyphase clock is often caused in relation to a position of timing at which two or more circuits related to the failure are operated.

In a semiconductor integrated circuit which is operated with low operating voltage and the miniaturization of which is accelerated, failure is sometimes caused by power supply noise made because multiple logic circuits are operated and by effect of crosstalk caused between signal wirings. When a problem occurs because of crosstalk between signal wires of a logic circuit operated in synchronization with clocks different in phase and/or frequency, the information of relation in phase between the respective clocks when the problem occurs and timing is required to be acquired. However, it is heretofore supposed that an integrated circuit is operated according to a single-phase clock and there was no measure to check at which timing of each clock failure was reproduced.

According to one of its aspects, the present invention provides a technique that enables recording and storing a situation in which failure is caused with LSI built in a product together with a state of a phase of a polyphase clock in a semiconductor device adopting the polyphase clock as an input clock, and that further facilitates the analysis of a position and a cause of the failure in LSI by checking whether the failure is reproduced depending upon a state of a phase of each clock.

Other aspects and characteristics of the invention will be apparent from the description of this specification and the accompanying drawings.

As one example of the invention, a semiconductor device including an integrated circuit operated with an input two- or more-phase clock is provided with an error detecting unit that detects the occurrence of a problem of the operation of the integrated circuit, a clock state holding unit that holds the information of phases in a predetermined term of the two- or more-phase clock, and an output unit that outputs the information of the phases in the predetermined term of the two- or more-phase clock according to the detection of the occurrence of the problem of the operation of the integrated circuit by the error detecting unit.

The reproducibility of the failure of the semiconductor device adopting the polyphase clock is enhanced, and a position and a cause of the failure can be easily analyzed.

BRIEF DESCRIPTION OF THE DRAWINGS

FIG. 5A shows a value of each flip-flop in the clock state storage circuit;

FIG. 5B shows waveforms of a polyphase clock to be reproduced;

FIG. 5C shows reproduced waveforms of the polyphase clock;

FIG. 7 shows an example of the detailed configuration of a clock reproducing circuit 601a;

FIG. 8A shows an example in which a value is set in a register of the clock reproducing circuit 601a.

DETAILED DESCRIPTION OF THE PREFERRED EMBODIMENT

Figure 1:
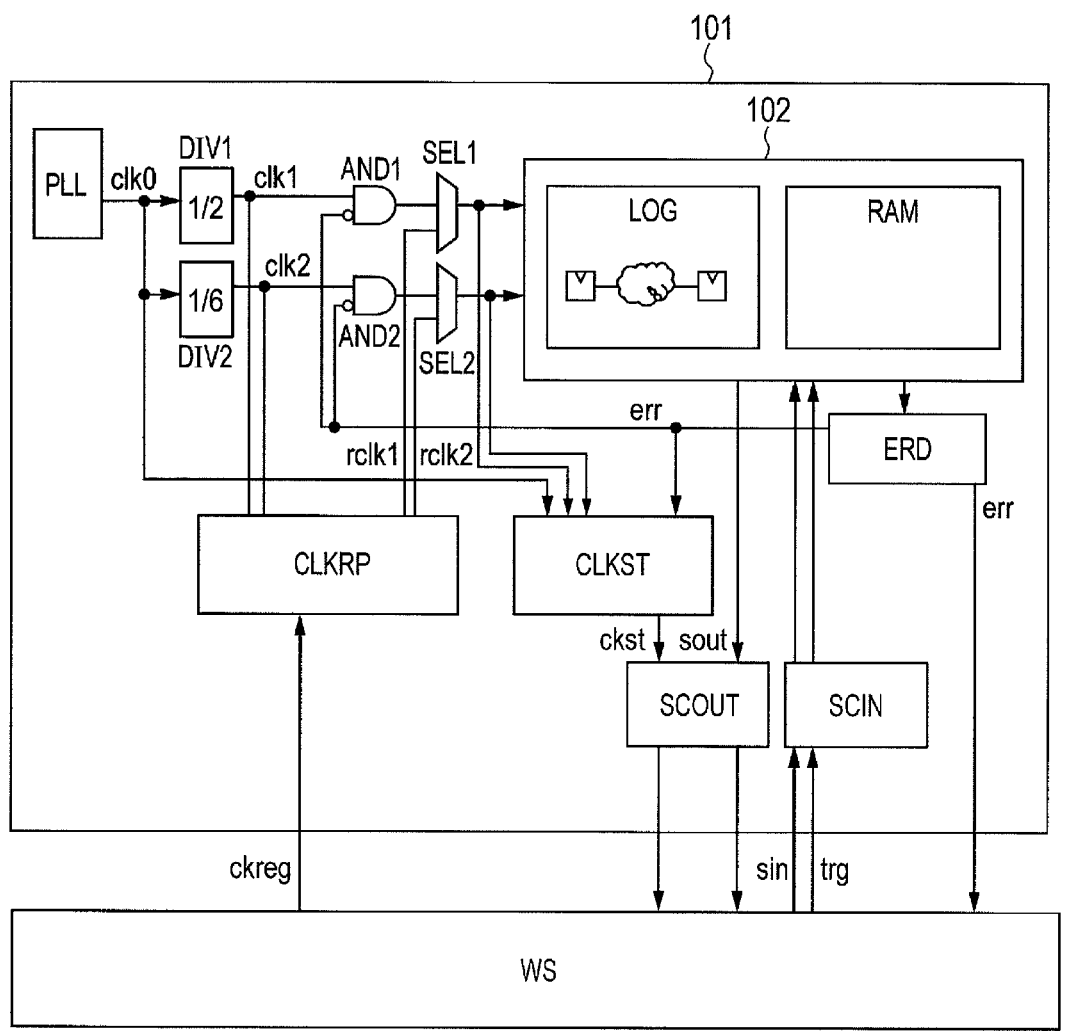
FIG. 1 shows a semiconductor device and a workstation for analyzing the failure of it.

Referring to the drawings, an embodiment of the invention will be described in detail below. In all the drawings for explaining the embodiment, the same reference numeral is allocated to the same member in principle and its repeated description is omitted.

FIG. 1 shows a semiconductor device 101 according to the invention and a workstation (WS) that analyzes its failure. FIG. 1 also shows the main configuration according to the invention of the semiconductor device 101. In the semiconductor device 101, a polyphase clock is adopted. In this embodiment, polyphase clocks clk1, clk2 are generated by dividing a frequency of an original clock clk0 generated by a phase-locked loop (PLL) with a frequency divider DIV. Needless to say, the generation of a polyphase clock is not limited to that in this case and a clock different in a frequency, duty or a phase may be also supplied to an integrated circuit 102. In normal operation, the polyphase clocks clk1, clk2 are supplied to the integrated circuit 102, and a logic circuit LOG and a memory RAM in the integrated circuit 102 are operated in synchronization with the supplied clocks. It is the integrated circuit 102 that is a target of failure analysis.

Figure 2:
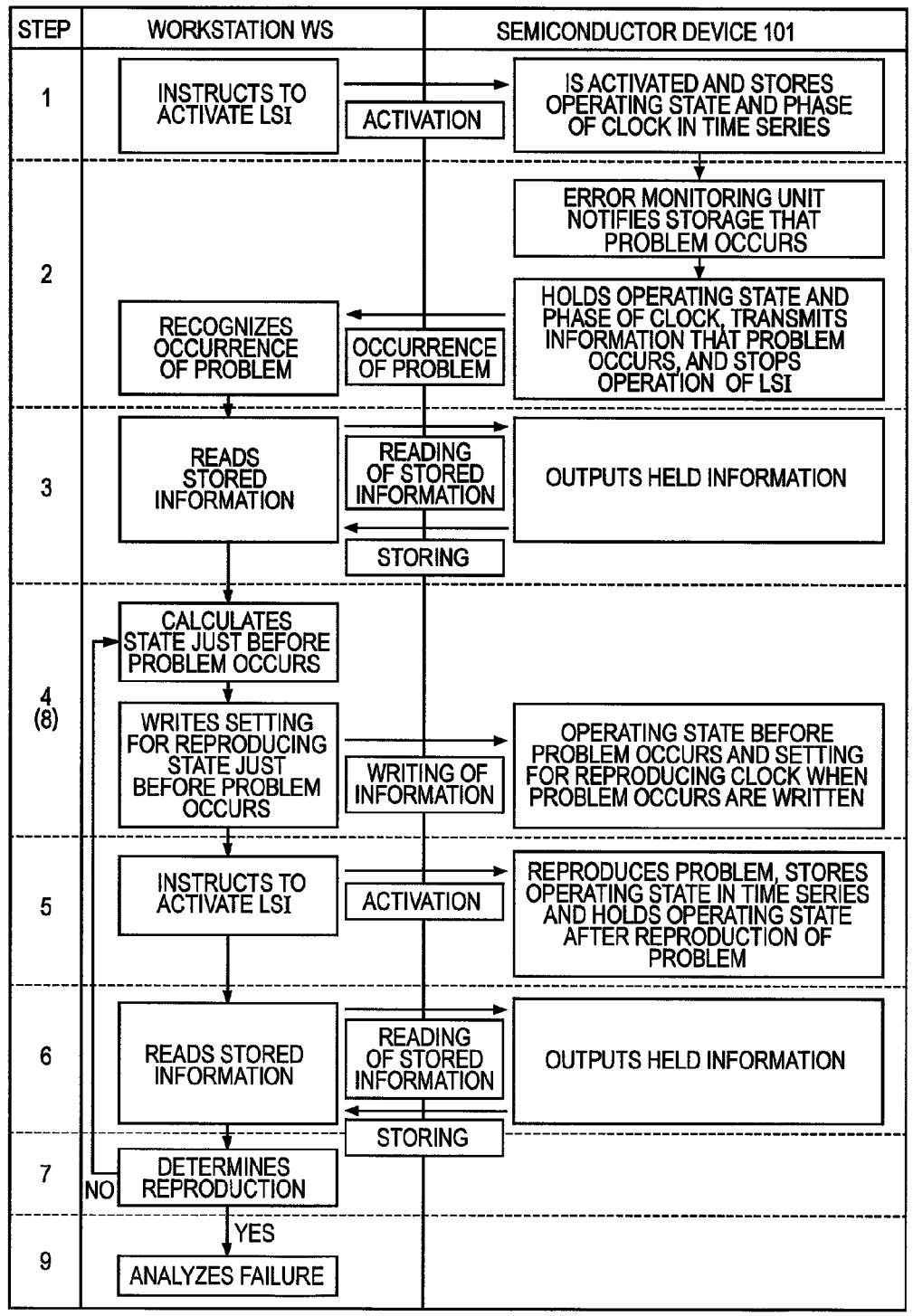
FIG. 2 is a flowchart for analyzing the failure of the semiconductor device.
Figure 3:
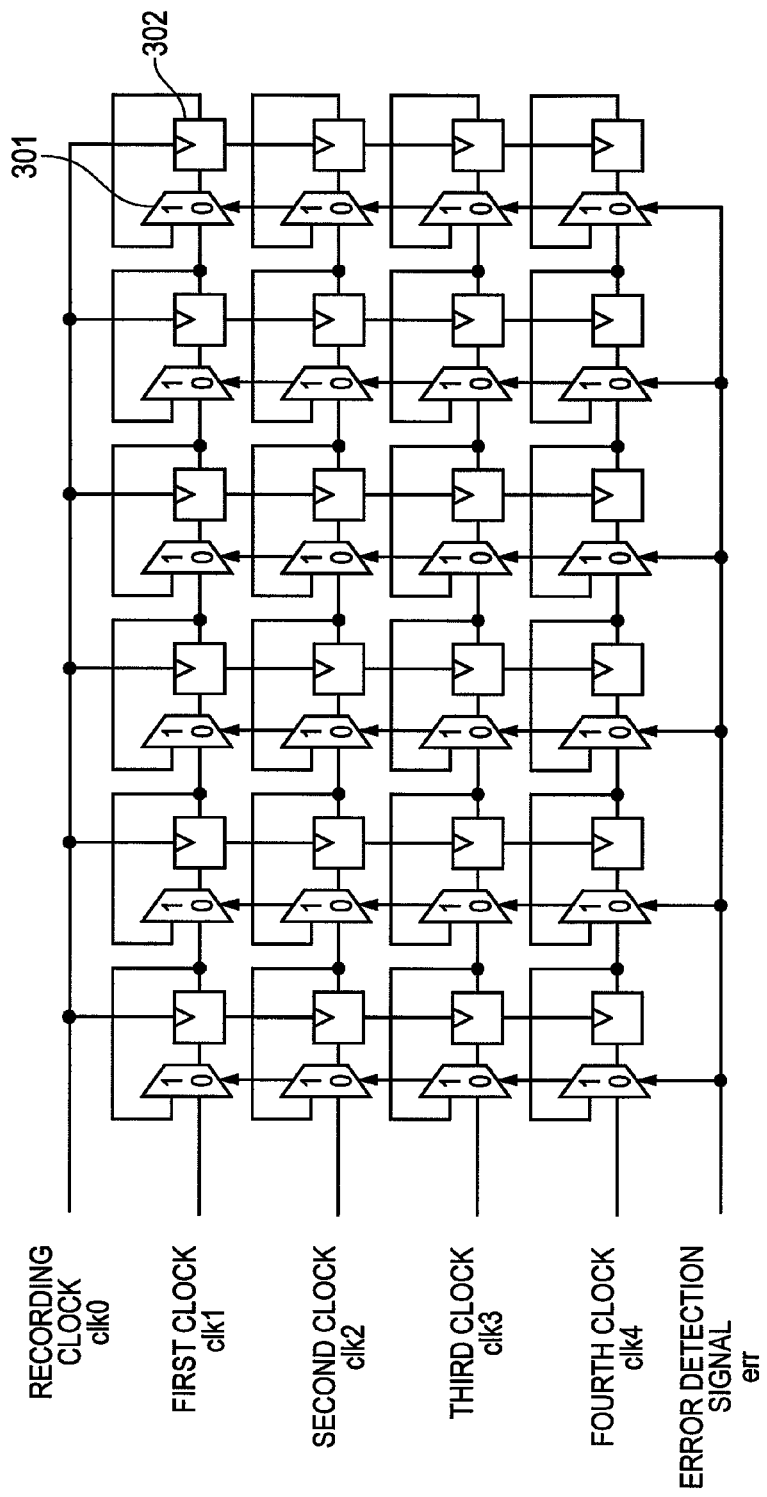
FIG. 3 shows an example of the configuration of a clock state storage circuit.
Figure 4:
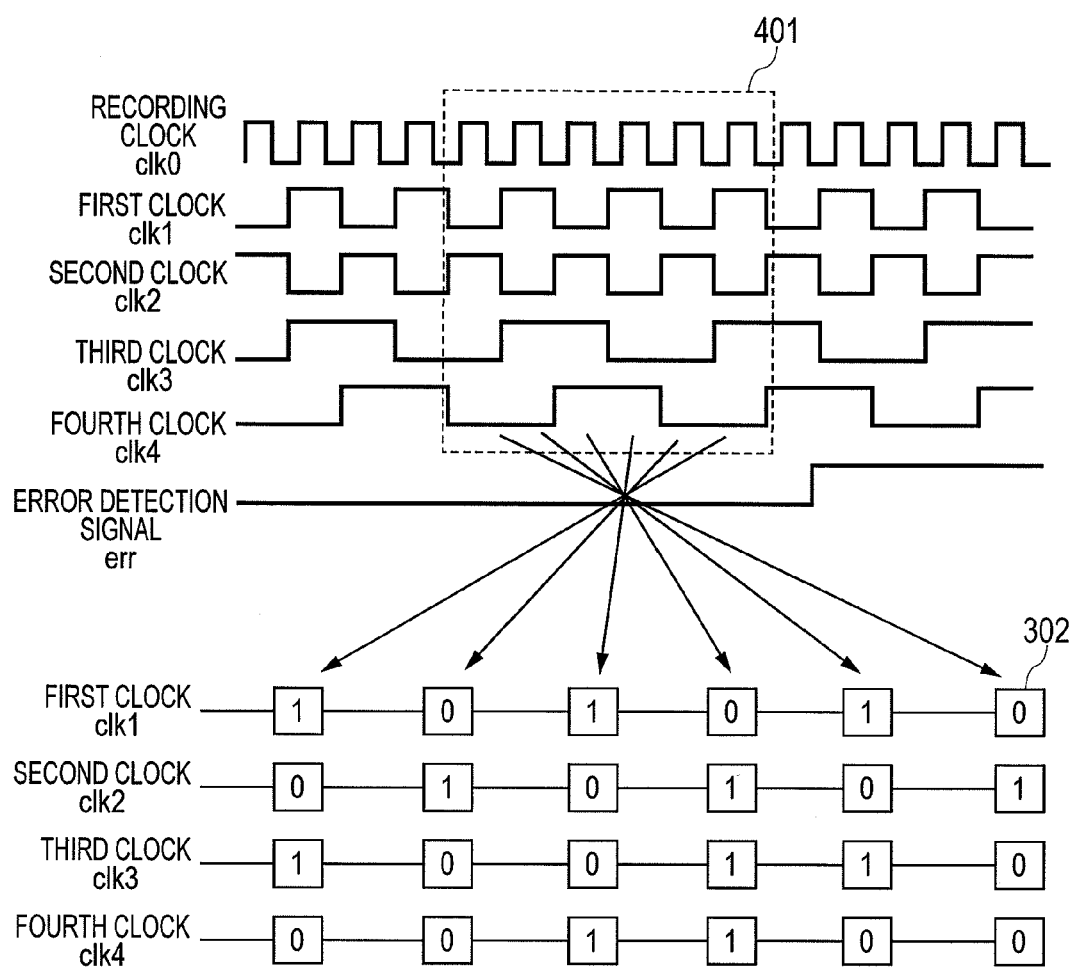
FIG. 4 shows operating waveforms of the clock state storage circuit shown in FIG. 3.

Referring to FIG. 2, the operation in failure analysis will be described below. The workstation WS activates the semiconductor device 101 to reproduce a failed state and operates it (step 1). In failure analysis, a clock state storage circuit CLKST in the semiconductor device 101 stores a state of the polyphase clocks supplied to the integrated circuit 102. FIG. 3 shows an example of the configuration of the clock state storage circuit CLKST. In this example, the clock state storage circuit can store a four-phase clock. FIG. 4 shows operating waveforms of the clock state storage circuit CLKST shown in FIG. 3.

As shown in FIG. 3, in the clock state storage circuit CLKST, a pair of a selector 301 and a flip-flop 302 is connected in series. A recording clock clk0 is input to each flip-flop 302. As shown in FIG. 4, a higher-frequency signal than polyphase clocks (first to fourth clocks in this example) to be recorded is used for the recording clock clk0. For example, for the recording clock clk0, the original clock clk0 output from PLL shown in FIG. 1 can be used. When an error detection signal err showing that an error is caused in the integrated circuit 102 is at a low level, the selector 301 selects each clock signal as the input of the flip-flop 302. Hereby, a state of the polyphase clock at a leading edge of the recording clock clk0 is stored in the flip-flop 302. A window 401 shown in FIG. 4 shows storable time and is set depending upon the number of the flip-flops 302 to which each clock is input. The storable time 401 can be extended by increasing the number of the flip-flops 302.

In the meantime, an error detector ERD of the semiconductor device 101 monitors the operation of the integrated circuit 102 and when the error detector detects an error, it turns the error detection signal err from the low level to a high level. The error detection signal err is transmitted to the workstation WS, and an operating state of the integrated circuit 102 and a clock phase state when the error detection signal err is turned to the high level are held (step 2 shown in FIG. 2). The error detector ERD can apply any suitable well-known method. A parity check of data and a method of duplexing a part of circuits and detecting nonconformity can be applied to the detection of an error.

As shown in FIG. 1, when the error detector ERD turns the error detection signal err to the high level, the input of the polyphase clocks to the integrated circuit 102 is cut off by AND gates AND1, AND2. Hereby, the operation of the integrated circuit 102 (that is, the update of a flip-flop included in the logic circuit LOG and the update of the memory RAM) is stopped. In the meantime, as shown in FIGS. 3 and 4, when the error detection signal err is turned to the high level, the selector 301 of the clock state storage circuit CLKST selects the output of the corresponding flip-flop 302. Hereby, the input of the clock to the flip-flop is stopped and a clock phase state when the error detection signal err is turned to the high level is held in the clock state storage circuit CLKST.

Afterward, the workstation WS outputs information held in the semiconductor device 101 on a display of the workstation WS (step 3 shown in FIG. 2). Though it is not shown, the logic circuit LOG and RAMBIST logic circuit of the memory RAM in the integrated circuit 102 are scanned. A value of the flip-flop in the logic circuit LOG and a value (sout) of the memory RAM when the error detection signal err is turned to the high level are read by the workstation WS via a scan out circuit SCOUT. Similarly, the flip-flop 302 in the clock state storage circuit CLKST is scanned and a value ckst of the flip-flop in the clock state storage circuit CLKST when the error detection signal err is turned to the high level is also read by the workstation WS via the scan out circuit SCOUT.

Hereby, the workstation WS can acquire the operating state of the integrated circuit 102 and a phase state of the polyphase clock when an error is caused. Then, an analyzer estimates information just before the occurrence of a problem based upon the information of the operating state when the problem occurs. For example, the analyzer estimates the operating state of the module based upon held information of a location of the problem and a circumference of the location, logically counts backward, and estimates a state in which all held information except the flip-flop of which an abnormal value is held when the problem occurs is reproduced. That is, a state having no problem is logically reproduced. When a state before one to a few cycles cannot be uniquely specified, the analyzer estimates plural states as candidates.

Generally, as for an operating state just before the occurrence of the problem which causes the occurrence of the problem, some candidates exist. As for an operating state of the semiconductor device 101, the operating state just before the occurrence of the problem is set, the polyphase clock is input at the same phase as that when the problem occurs, and if the same error is caused, it can be determined that the failure is reproduced (steps 4 to 7 shown in FIG. 2). When it is not determined in the step 7 that the failure is reproduced, the steps 4 to 7 are repeated with another candidate as a target.

Failure analysis is enabled by the final reproduction of the failure (step 9 shown in FIG. 2).

In the step 4, the operating state before the occurrence of the problem estimated by the analyzer and the reproduction of the clock from the state are set. The operating state before the occurrence of the problem is written to the integrated circuit 102 from the workstation WS via a scan in circuit SCIN. Also, setting information ckreg for reproducing the clock is written to a clock reproducing unit CLKRP. In a step 5, the clock reproducing unit reproduces the polyphase clock at the same phase as that when the problem occurs based upon the setting information ckreg and operates the semiconductor device 101.

A method disclosed in Japanese Unexamined Patent Application Publication No. 2003-222656 for example can be applied to the reproduction of the polyphase clock. Referring to FIGS. 5 to 8, a method of reproducing the polyphase clock will be described below. Suppose that a problem occurs in a state shown in FIG. 4. A value ckst shown in FIG. 5A of each flip-flop in the clock state storage CLKST is input to the workstation WS. As a value of each clock at the leading edge of the recording clock clk0 is known by the value ckst, waveforms of the polyphase clock to be reproduced are known (a window 501 shown in FIG. 5B). The reproduced waveforms of the clock to reproduce failure are waveforms of the clock until the problem occurs since an operating state before the occurrence of the problem set by the analyzer and a part of or all waveforms in the window 501 are reproduced. In this example, a case that pulses shown by thick lines in FIG. 5C are reproduced will be described.

Figure 6:
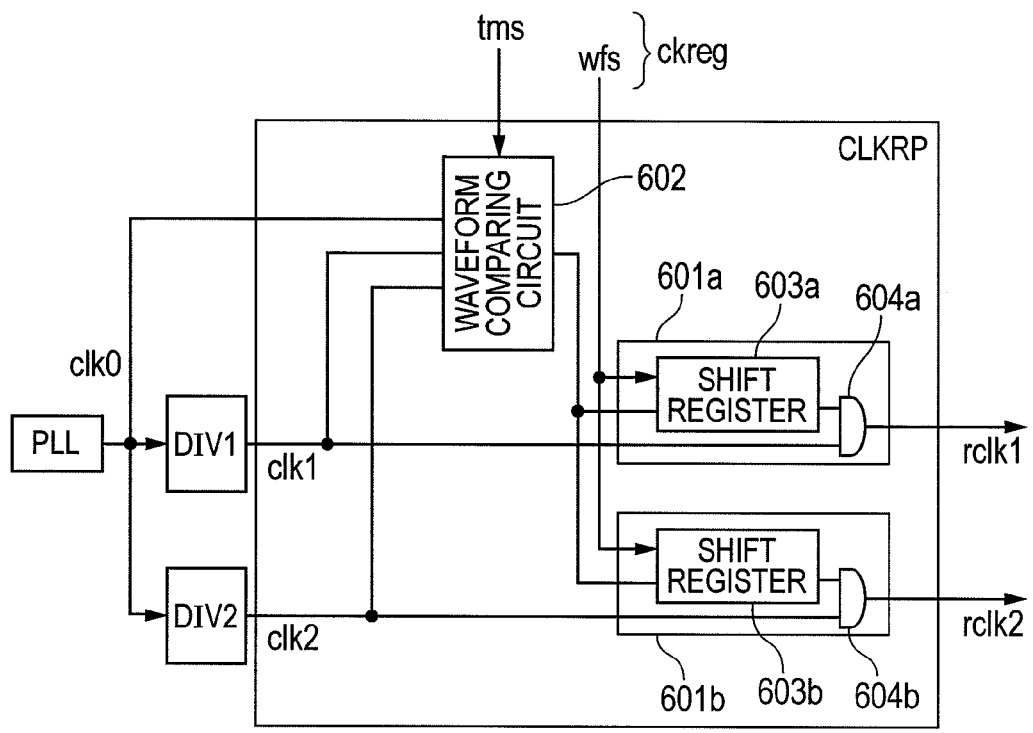
FIG. 6 shows an example of the configuration of a clock reproducing unit CLKRP.

FIG. 6 shows the configuration of the clock reproducing unit CLKRP. The clock reproducing unit CLKRP is provided with clock reproducing circuits 601a, 601b and a waveform comparing circuit 602. Setting information ckreg from the workstation WS includes timing setting information tms and waveform setting information wfs. The timing setting information tms is input to the waveform comparing circuit 602, and the waveform setting information wfs is input to the clock reproducing circuits 601a, 601b.

Referring to FIG. 5C, a method of specifying reproduced pulses will be described below. In this embodiment, to specify the reproduced pulses, timing 502 to be a reference is first specified and some pulses from a trailing edge of the clock after the timing are reproduced. Therefore, a state of each clock at the timing to be the reference is set as the timing setting information tms. In an example shown in FIG. 5C, as a value of each clock (clk1, clk2, clk3, clk4) at the timing 502 to be the reference is (a low level, a high level, a high level and a high level), (0, 1, 1, 1) is set as the timing setting information tms. Besides, in the case of the first clock clk1, as three pulses from the trailing edge of the first clock after the timing to be the reference are reproduced as pulses to be reproduced and the reproduction of a fourth pulse is not required, (1, 1, 1, 0) is set as the waveform setting information wfs of a reproduced clock rclk1 of the first clock clk1. As for the second clock clk2 to the fourth clock clk4, the waveform setting information wfs is similarly set.

Figure 7:
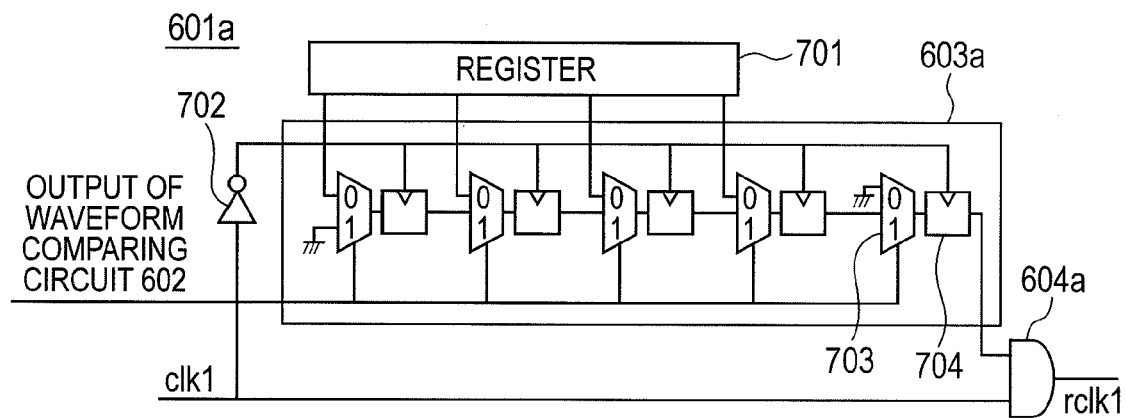

FIG. 7 shows an example of the detailed configuration of a clock reproducing circuit 601a. A shift register 603a is configured by the series connection of a pair of a selector 703 and a flip-flop 704. The more pairs that are connected in series, the more maximum pulses are reproducible. The flip-flop 704 is operated in synchronization with a clock signal acquired by making the first clock clk1 an anti-phase via an inverter 702. As the waveform comparing circuit selects the input of '1' till timing at which the polyphase clock is to be a reference, the output of the reproduced clock rclk1 from the selector 703 remains a low level.

In the waveform comparing circuit 602, a value of each clock is compared at the timing of the original clock clk0 and at timing at which a phase of the polyphase clock coincides with a state set in the timing setting information tms, the signal is turned from 0 to 1. Hereby, the selector 703 of the shift register 603a selects the input of '0'. The reason why the value of each clock is compared at the timing of the original clock clk0 is that the use of the original clock generated by PLL is supposed for a recording clock clk0 shown in FIG. 6. The comparison of waveforms is required to be made using the recording clock used to record the polyphase clock for a reference.

Figure 8A:
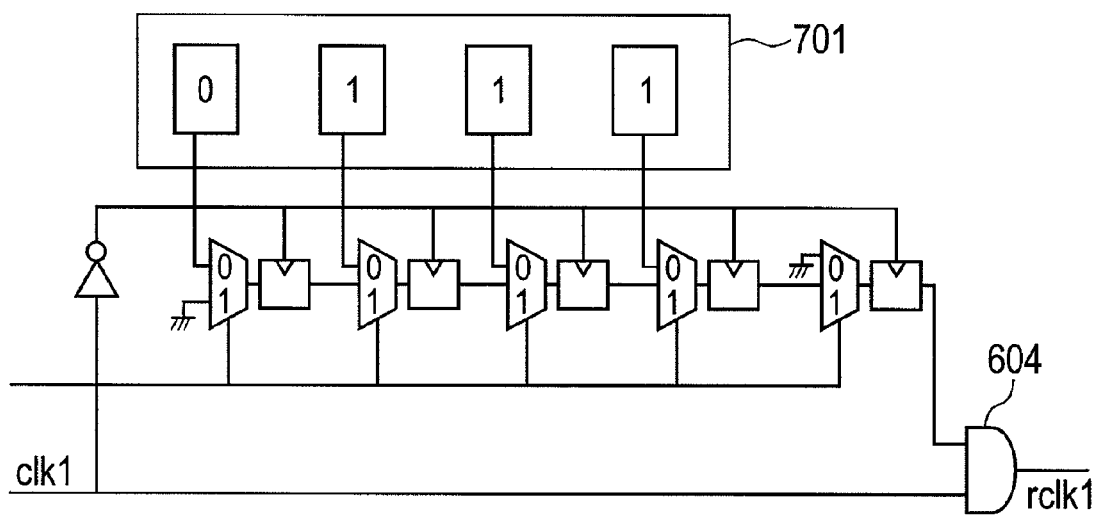
Figure 8B:
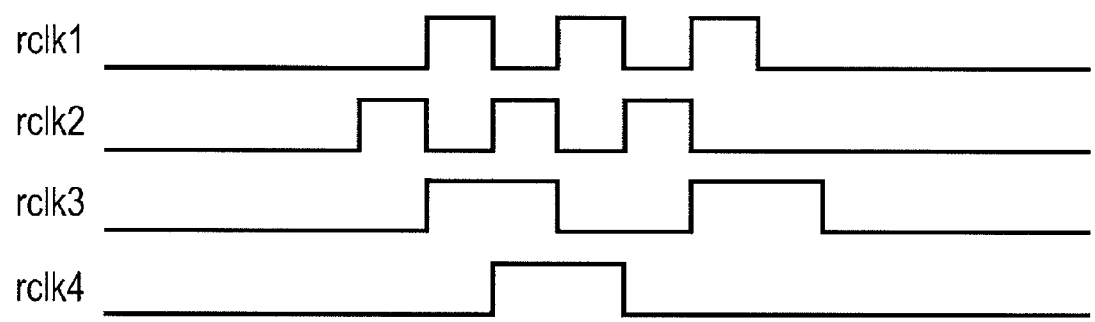
FIG. 8B shows waveforms of a reproduced clock.

FIG. 8A shows a state in which the waveform setting information wfs for the reproduced clocks rclk1 shown in FIG. 5C is set in a register 701. FIG. 8B shows waveforms of the reproduced clocks. As described above, when the output of the waveform comparing circuit 602 is turned from 0 to 1, the selector 703 selects the output of '0'. Hereby, a pulse (that is, a register value is 1) specified by the register 701 from the first trailing edge after the timing to be the reference passes a gate 604 and the reproduced clock rclk is output.

In the step 5 shown in FIG. 2, a state before the problem occurs is set via the scan in circuit SCIN and the semiconductor device 101 is operated by a trigger trg. An actuating clock at this time is operated by the reproduced clock reproduced as described referring to FIGS. 5 to 8. An operating state as a result is recorded as in the step 6 and can be output to the workstation WS.

When operating state information when the problem occurs and operating state information in second operation coincide, operating states of the integrated circuit 102 before and after the problem occurs and clock timing information are acquired. The workstation WS analyzes a position and a cause of the failure of the integrated circuit 102 based upon this information.

The present invention has been concretely described based upon the illustrative embodiment. However, the invention is not limited to the embodiment and various modifications are possible consistent with the principles described herein.

What is claimed is:

1. A semiconductor device including an integrated circuit operated according to a two- or more-phase clock, comprising:
   an error detecting unit that detects that a problem of the operation occurs in the integrated circuit;
   a clock state holding unit that holds the information of phases in a predetermined term of the two- or more-phase clock;
   an output unit that outputs the information of the phases in the predetermined term of the two- or more-phase clock when the error detecting unit detects that the problem of the operation occurs in the integrated circuit; and
   a clock reproducing unit for reproducing a state in which a problem occurs from an operating state before the error detecting unit detects the problem with a two- or more-phase reproduced clock having the same physical relationship in which the problem is detected as that in normal operation.

2. The semiconductor device according to claim 1,
   wherein the clock state holding unit records a state of the two- or more-phase clock based upon a recording clock having a higher frequency than a frequency of the two- or more-phase clock.

3. The semiconductor device according to claim 1,
wherein a flip-flop in the clock state holding unit is scanned; and
wherein the phases in the predetermined term of the two- or more-phase clock held in the clock state holding unit are read by an external device of the semiconductor device via a scan out circuit.

4. The semiconductor device according to claim 1,
wherein the two- or more-phase clock includes clocks mutually different in a frequency.

5. The semiconductor device according to claim 1,
wherein the integrated circuit is scanned; and
wherein a value held in a flip-flop in the integrated circuit when the error detecting unit detects that a problem of the operation occurs in the integrated circuit is read by an external device of the semiconductor device via a scan out circuit.

* * * * *